(12) United States Patent
Li (10) Patent No.: US 9,906,152 B2
(45) Date of Patent: Feb. 27, 2018

(54) FREQUENCY CONVERTER (71) Applicant: Telefonaktiebolaget L M Ericsson (publ), Stockholm (SE)

(72) Inventor: Yinggang Li, Askim (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 21 days.

(21) Appl. No.: 14/906,746

(22) PCT Filed: Jul. 22, 2013

(86) PCT No.: PCT/EP2013/065448
§ 371 (c)(1),
(2) Date: Jan. 21, 2016

(87) PCT Pub. No.: WO2015/010720
PCT Pub. Date: Jan. 29, 2015

(65) Prior Publication Data
US 2016/0164426 A1    Jun. 9, 2016

(51) Int. Cl.
*H04L 27/00* (2006.01)
*H02M 5/02* (2006.01)
*H03D 7/16* (2006.01)

(52) U.S. Cl.
CPC ............ *H02M 5/02* (2013.01); *H03D 7/165* (2013.01)

(58) Field of Classification Search
CPC ......... H03D 2200/0086; H03D 7/1475; H03D 7/165; H02M 5/02
See application file for complete search history.

(56) References Cited

U.S. PATENT DOCUMENTS

| | | | | |
|---|---|---|---|---|
| 2002/0012407 A1* | 1/2002 | Sakurai | .................. | H03D 3/008 375/327 |
| 2007/0298750 A1* | 12/2007 | Masuda | .................. | H03B 21/02 455/323 |
| 2011/0306300 A1* | 12/2011 | Behera | ..................... | H03D 7/18 455/47 |

FOREIGN PATENT DOCUMENTS

| | | |
|---|---|---|
| EP | 1443640 A1 | 8/2004 |
| WO | 0237787 A1 | 5/2002 |

* cited by examiner

*Primary Examiner* — Shuwang Liu
*Assistant Examiner* — Sung Ahn
(74) *Attorney, Agent, or Firm* — Rothwell, Figg, Ernst & Manbeck, p.c.

(57) ABSTRACT

A frequency converter (100, 200, 300, 500, 600) comprising a first mixer (105) arranged to receive a first and a second input signal and to have as its output the sum and the difference of the first and second input signals. The frequency converter (100, 200, 300, 500, 600) also comprises generating means (120) for generating the second input signal and for receiving the output signal of the first mixer (105) and multiplying it by a signal at a frequency which is two times the frequency of the second input signal, thereby generating a product. The frequency converter (100, 200, 300, 500, 600) also comprises adding means (110) for obtaining the sum of this product and the output signal from the first mixer.

8 Claims, 6 Drawing Sheets

FREQUENCY CONVERTER

CROSS-REFERENCE TO RELATED APPLICATIONS

This application is a 35 U.S.C. § 371 National Phase Entry Application from PCT/EP2013/065448, filed Jul. 22, 2013, and designating the United States.

TECHNICAL FIELD

The present invention discloses a novel frequency converter.

BACKGROUND

Frequency converters are used in order to convert an electromagnetic signal at one frequency to another frequency. The frequency conversion can be either up-conversion or down-conversion, i.e. a signal at a certain frequency can be shifted either to a higher or a lower frequency. Frequency converters are used in such systems as, for example, radio communications systems and radar systems.

A traditional frequency converter uses a mixer which has as its input signals the signal whose frequency it is desired to shift and a signal at another frequency, and provides as output the mixing product of the input signals. This product comprises so called sum and difference signals, i.e. signals at frequencies which are the sum and the difference of the frequencies of the input signals.

The parameter usually referred to as conversion gain, defined as the ratio of the power (or, alternatively, voltage) of the output signal to the power (or alternatively, voltage) of the input signal whose frequency is shifted in the frequency converter, is a parameter which it is naturally a desire to improve on in frequency converters.

SUMMARY

It is an object to provide a frequency converter with improved conversion efficiency. This object is obtained by means of a frequency converter which comprises a first mixer arranged to receive a first and a second input signal, and to have as its output the sum and the difference of the first and second input signals.

The frequency converter also comprises generating means for generating the second input signal and for receiving the output signal of the first mixer and multiplying it by a signal at a frequency which is two times the frequency of the second input signal, thereby generating a product. In addition, the frequency converter also comprises adding means for obtaining the sum of said product and the output signal from the first mixer.

By means of this frequency converter, increased conversion efficiency can be obtained, as will be shown in the following detailed description.

In embodiments of the frequency converter, the generating means comprise a local oscillator and a second order sub-harmonic mixer, and the second order sub-harmonic mixer is arranged to receive as input signals the output signal from the local oscillator and the output from the first mixer.

In embodiments of the frequency converter, the generating means comprise a dual-band local oscillator which is arranged to output a signal at frequency $f_{LO}$ to the first mixer and a signal at frequency $2*f_{LO}$ to a second mixer which is also comprised in the frequency converter and which is arranged to also receive as an input signal the output from the first mixer.

In embodiments of the frequency converter, the generating means comprise a local oscillator connected to a frequency multiplier with a multiplication factor of two, and a second mixer which is arranged to receive as input signals the output signal from the frequency multiplier and the product from the first mixer.

In embodiments of the frequency converter, the generating means is arranged to receive the output signal of the first mixer via a band-pass filter which is arranged to remove a sum or a difference component in the output from the first mixer.

In embodiments, the frequency converter also comprises a band-pass filter for removing the sum or the difference obtained in the adding means.

BRIEF DESCRIPTION OF THE DRAWINGS

The invention will be described in more detail in the following, with reference to the appended drawings, in which.

DETAILED DESCRIPTION

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

Figure 1:
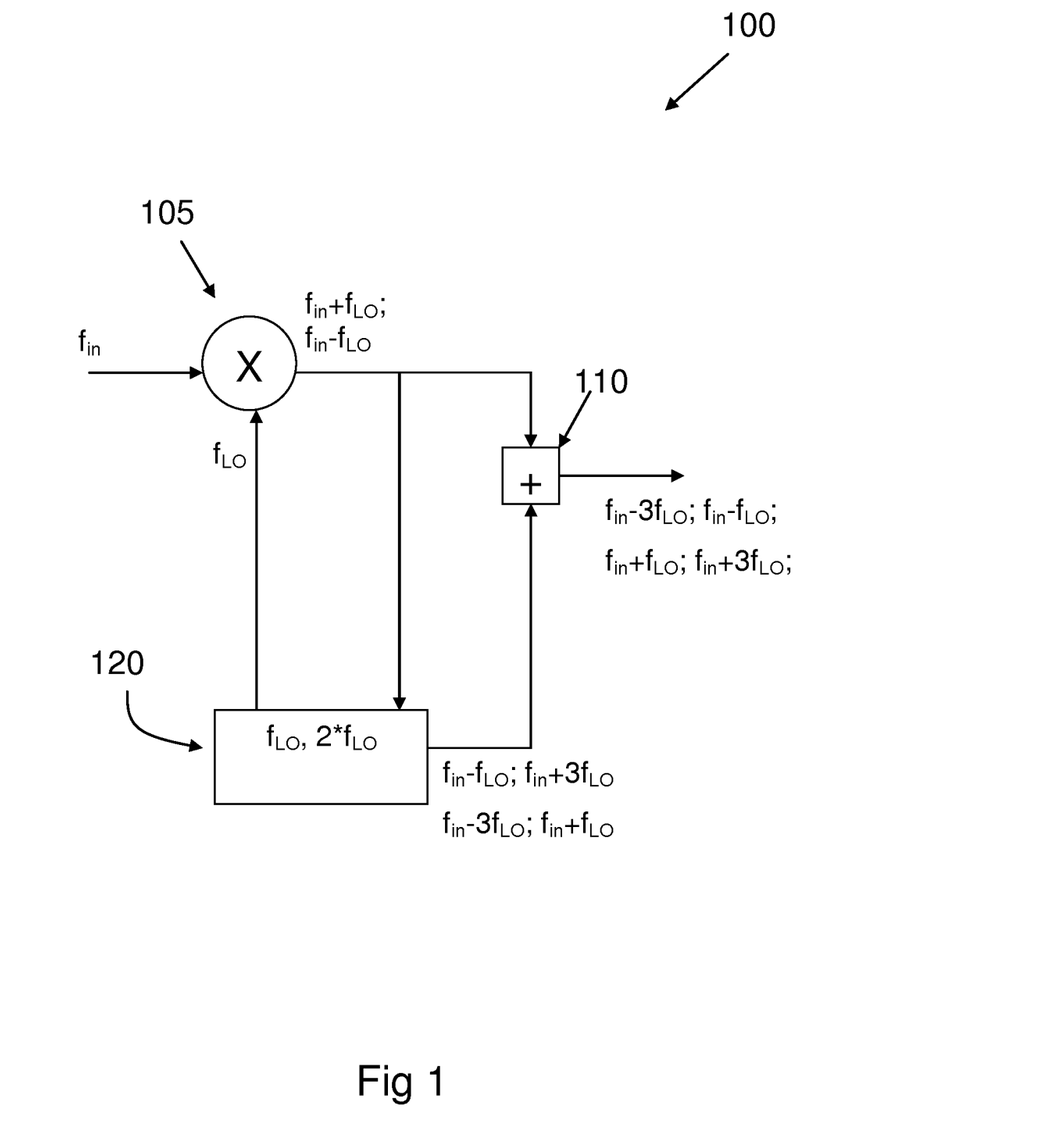
FIG. 1 shows a first embodiment of a frequency converter.

FIG. 1 shows a first embodiment of a frequency converter 100. The frequency converter 100 comprises a first mixer 105, arranged to receive two input signals, exemplified by a signal shown as $f_{in}$ and another signal shown as a signal $f_{LO}$. The signal $f_{in}$ can, for example, be a received signal if the frequency converter 100 is used in a receiver in a radio or a radar system, in which case the frequency converter 100 is used for so called down-conversion of the received signal, i.e. in order to "shift" the received signal to a lower frequency.

On the other hand, the frequency converter 100 can also be used in a transmitter in a radio or a radar system, so that the signal $f_{in}$ is a signal intended for transmission, in which case the frequency converter 100 is used for so called up-conversion of the signal $f_{in}$, i.e. in order to "shift" the received signal $f_{in}$ to a higher frequency.

In short, the frequency converter 100 can be used either for up-conversion or for down-conversion of the frequency of the signal $f_{in}$. In the following, down-conversion by means of the frequency converter 100 will be described, but those skilled in the art will realize how a corresponding up-conversion can be obtained by means of the frequency converter 100.

The first mixer 105 is arranged to have as its output signals(s) both a sum and a difference between the two input signals, i.e. the output signal(s) from the first mixer 105 can, as shown in FIG. 1, be written as $(f_{in}+f_{LO})$ and $(f_{in}-f_{LO})$.

The signal $f_{LO}$, a so called "local oscillator" signal, is supplied to the first mixer 105 from a means 120 for generating the signal $f_{LO}$. The means 120 is also arranged, as shown in FIG. 1, to receive as input signal(s) the output from the first mixer, i.e. in the case shown in FIG. 1 $(f_{in}+f_{LO})$ and $(f_{in}-f_{LO})$. In addition, the means 120 is arranged to mix its input signal(s) by a signal at a frequency which is 2 times the frequency of the second input signal $f_{LO}$ to the first mixer, i.e. multiplication by $N*f_{LO}$.

The multiplication of $(f_{in}+f_{LO})$ and $(f_{in}-f_{LO})$ by $*2f_{LO}$, yields as output signal(s) from the means 120 the following, as is also shown in FIG. 1: $f_{in}-f_{LO}$; $f_{in}+3f_{LO}$; $f_{in}-3f_{LO}$; $f_{in}+f_{LO}$ As shown in FIG. 1, the frequency converter 100 comprises an adder 110 for obtaining the sum of the output signal(s) from the first mixer 105 and from the means 120. The sums obtained in the adder are, as is also shown in FIG. 1: $f_{in}-f_{LO}$; $f_{in}+3f_{LO}$; $f_{in}-3f_{LO}$; $f_{in}+f_{LO}$, which is thus the output signal(s) from the adder 110. As shown in FIG. 1, the output signal(s) from the adder 110 in FIG. 1 is (are) also the output signal(s) from the frequency converter 100. One example of a component that can be used as the adder 110 is a so called power combiner.

Any of the components present in the output signal(s) from the adder 110 and thus in the output signal(s) from the frequency converter 100 can be "extracted" so that it is the sole component in the output signal from the frequency converter 100 by means of filtering the output signal(s) from the adder 110, for example by means of a band-pass filter, which will be shown in more detail in the embodiments shown in FIGS. 2 and 4-6.

Figure 2:
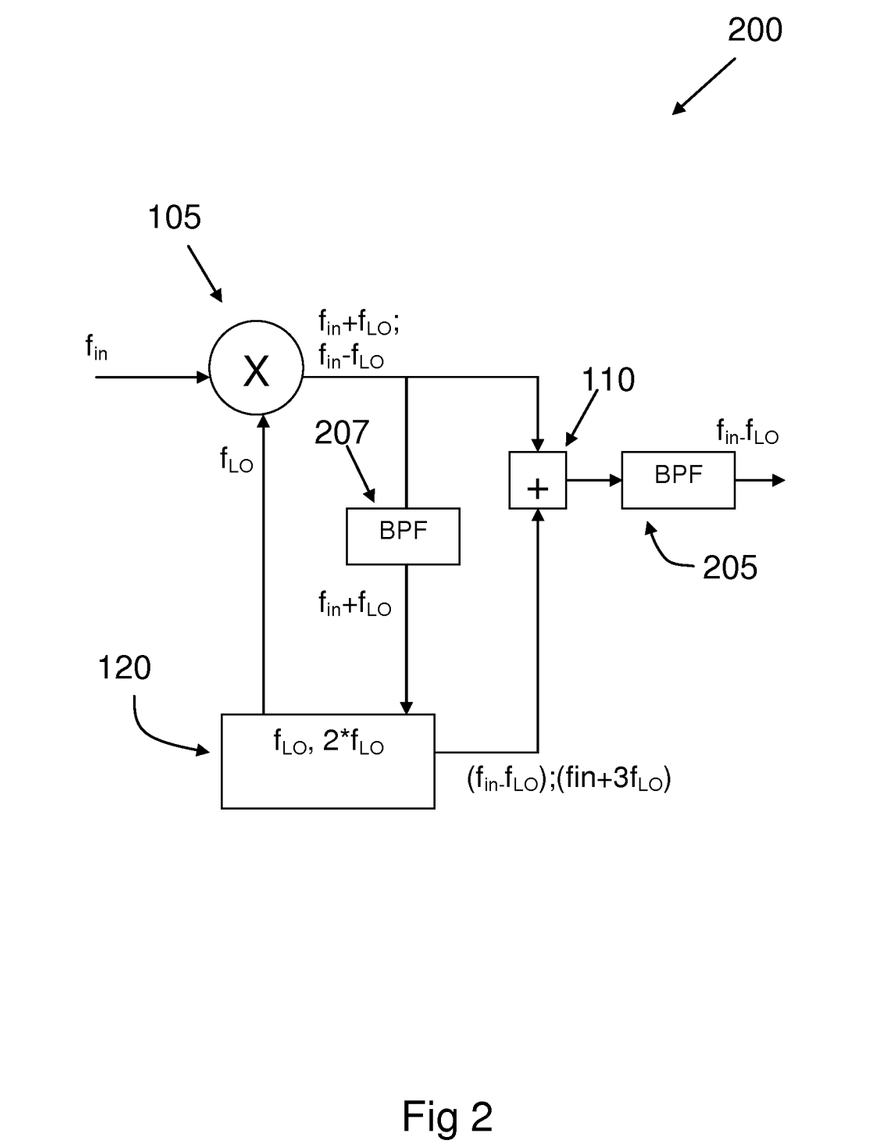
FIG. 2 shows a version of the embodiment of FIG. 1.

FIG. 2 shows a version 200 of the frequency converter from FIG. 1: the frequency converter 200 comprises a filter 207, in this case a band pass filter, which is arranged so as to eliminate one of the components in the input signal to the generating means 120 from the first mixer 105, i.e. either $(f_{in}+f_{LO})$ or $(f_{in}-f_{LO})$, depending on the effect that it is desired to achieve with the frequency converter 100. In the example shown in FIG. 2, the band pass filter 207 is arranged to eliminate the component $(f_{in}-f_{LO})$. As a consequence of the filter 205, the output from the generating means 120 becomes $(f_{in}-f_{LO})$; $(f_{in}+3f_{LO})$. The frequency converter 200 in FIG. 2 also comprises a filter 205 arranged to eliminate all but one of the components in the output signal(s) from the adder 110, in this case the component $f_{in}+f_{LO}$, since, as mentioned initially, the frequency converter as described herein is arranged for frequency down-conversion. However, depending on the effects that it is desired to obtain by means of the frequency converter 200, the component which the filter 205 is arranged to admit, i.e. to not eliminate, can be varied. The same is true for the filter 207, so that, for example, if it is desired to use the frequency converter 200 for "up-conversion" instead of "down-conversion", the filter 207 should be designed to admit only the component $f_{in}-f_{LO}$, and the filter 205 should be designed to admit only the component $f_{in}+f_{LO}$.

Figure 3:
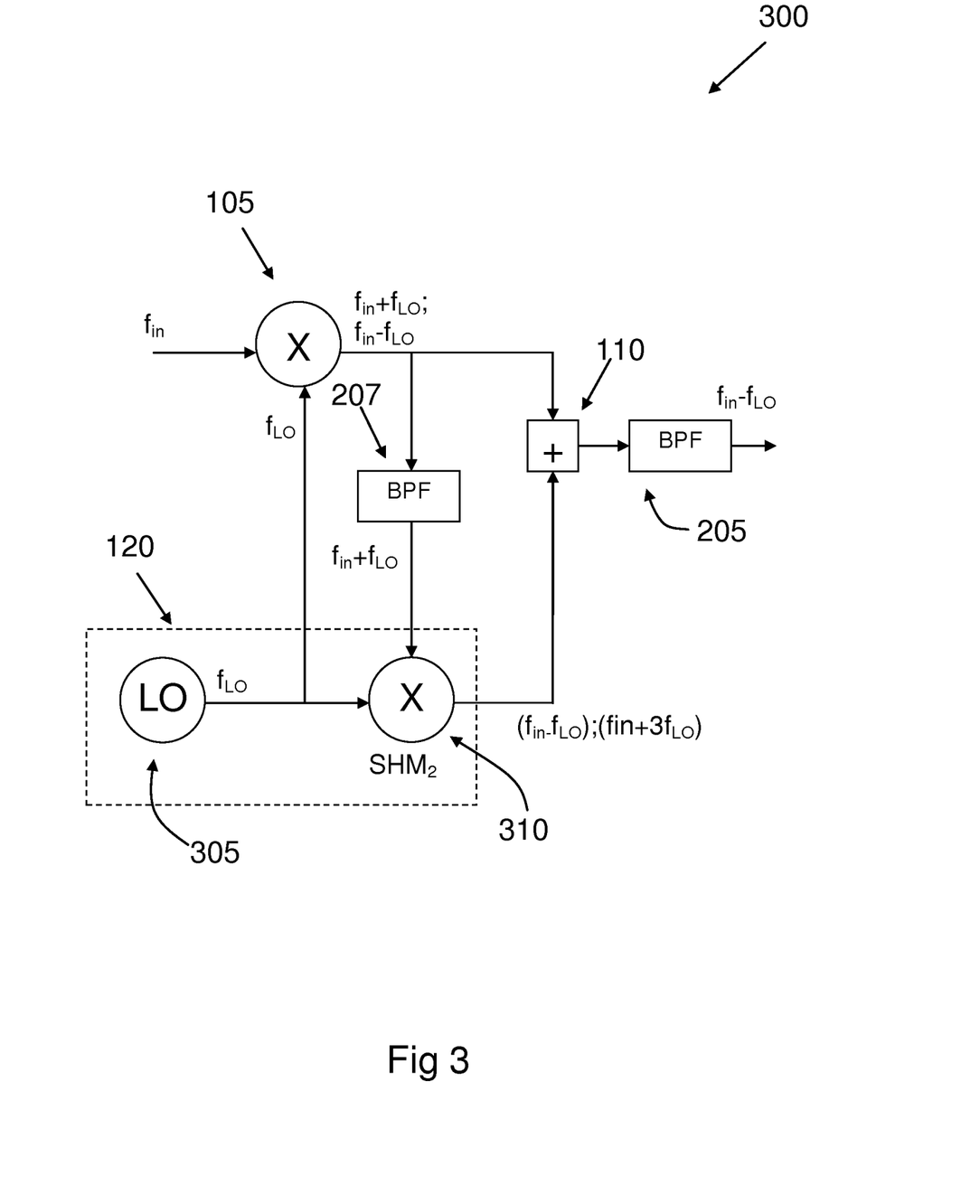
FIG. 3 shows a more detailed embodiment of the embodiment of FIG. 2.

FIG. 3 shows a more detailed embodiment 300 of the frequency converter 200 shown in FIG. 2. The frequency converter 300 shows a first embodiment of the generating means 120: as shown, the generating means 120 in this embodiment comprise a Local Oscillator, LO 305, which generates a signal at a frequency $f_{LO}$. The generating means 120 also comprises a second order sub-harmonic mixer, shown as $SHM_2$ 310. A second order sub-harmonic mixer is defined as a mixer component which, for a given input LO signal at frequency $f_{LO}$ and a second input signal, e.g. an RF signal at frequency $f_{RF}$, produces output signals which an "ordinary" mixer would have needed an LO signal at twice the frequency, i.e. $2*f_{LO}$, to produce.

The term "ordinary mixer" is here used in the sense of a mixer component that receives as inputs a first signal at a frequency $f_1$ and a second signal at a frequency $f_2$ and produces output signals at frequencies $f_{out}=(f_1 \pm f_2)$. In the definition of the $SHM_2$ above, the two frequencies $f_1$ and $f_2$ can be the LO and RF signals.

The output signal from the LO 305 is fed to both the first mixer 105 and to the $SHM_2$ 310.

As shown in FIG. 3, due to the properties explained above of the $SHM_2$ 310, the output signal(s) from the generating means 120 is the one shown in FIG. 3, i.e. $(f_{in}-f_{LO}; f_{in}3+f_{LO})$, which thus, after the adder 110 and the filter 205 gives us the output signal from the frequency converter 300 which was shown in FIG. 2, i.e. $f_{in}-f_{LO}$.

A more theoretical description of the function of the frequency converter 300 is as follows: Mathematically, the output from the first mixer 105 can be seen as follows if we use y(t) to denote the output from the mixer 105 and the symbol ω with respective indices to denote the frequencies involved and the letter A with indices to denote the amplitudes involved:

$$y_1(t) = A_{in}\cos\omega_{in}t \cdot A_{Lo1}\cos\omega_{LO}t \qquad \text{(Equation 1)}$$

$$= \frac{1}{2}A_{in}A_{LO1}[\cos(\omega_{in}-\omega_{LO})t + \cos(\omega_{in}+\omega_{LO})t]$$

In a traditional frequency converter, in the case of down-conversion, only the difference term in equation 1, i.e. $(\omega_{in}-\omega_{LO})$ is used, and the conversion gain of such a frequency converter therefore becomes:

$$G_{V1} = \frac{1}{2}A_{in}A_{LO1}/A_{in} = \frac{1}{2}A_{LO1} \qquad \text{(Equation 2)}$$

Similarly, if a second mixer is applied to mix the sum term $(\omega_{in}+\omega_{LO})$ in equation 1 with a signal at frequency $2*\omega_{LO}$, i.e. $A_{LO2}\cos(2\omega_{LO}t)$, the following components will be obtained at the output of the second mixer:

$$y_2(t) = \frac{1}{2}A_{in}A_{LO1}\cos(\omega_{in}+\omega_{LO})t \cdot A_{LO2}\cos(2\omega_{LO}t) \qquad \text{(Equation 3)}$$

$$= \frac{1}{4}A_{in}A_{LO1}A_{LO2}[\cos(\omega_{in}-\omega_{LO})t + \cos(\omega_{in}+3\omega_{LO})t]$$

To avoid generating the component $2 \cdot \omega_{LO}$ signal in the second mixer the second order $SHM_2$ is chosen as the "second mixer", i.e. the $SHM_2$ 310, as shown in FIG. 3. Therefore, the LO frequency which is actually required is not $2 \cdot \omega_{LO}$, but its second order sub-harmonic $\omega_{LO}$. This allows one and the same LO, in this case the LO 305, to be used to "drive" both mixers, i.e. the mixer 105 and the $SHM_2$ 310.

It can be observed that equation 3 also contains the desired difference frequency component ($\omega_{in}-\omega_{LO}$), i.e. the desired difference frequency component if the frequency converter 300 is to be used for down-conversion.

Now, combining constructively (i.e. in-phase) the difference frequency term from equation 1 and equation 3 results in a total output of the desired frequency component:

$$y_-(t) = \left[\frac{1}{2}A_{in}A_{LO1} + \frac{1}{4}A_{in}A_{LO1}A_{LO2}\right]\cos(\omega_{in}-\omega_{LO})t \quad \text{(Equation 4)}$$

$$= A_{in}\frac{1}{2}A_{LO1}\left(1+\frac{1}{2}A_{LO2}\right)\cos(\omega_{in}-\omega_{LO})t$$

Therefore, the total conversion gain of the frequency converter 300 becomes:

$$G_v = G_{v1}(1+G_{v2}) \quad \text{(Equation 5)}$$

Or, in decibel, dB:

$$G_v(dB_v) = G_{v1}(dB_v) + 20\log(1+G_{v2}) \quad \text{(Equation 6)}$$

where $$G_{V2} = \frac{1}{2}A_{LO2}$$

is the conversion gain of the "second mixer", i.e. the $SHM_2$ 310 in FIG. 3.

From equation 5, it is clear that the frequency converter 300 shown in FIG. 3 (as well as those shown in FIGS. 1 and 2) increases the conversion gain by a factor of $(1+G_{v2})$ as opposed to the conversion gain provided by the first mixer (105) alone. For example, if the $SHM_2$ 310 has a unit voltage gain, the total voltage gain will theoretically increase by 6 dB.

Figure 4:
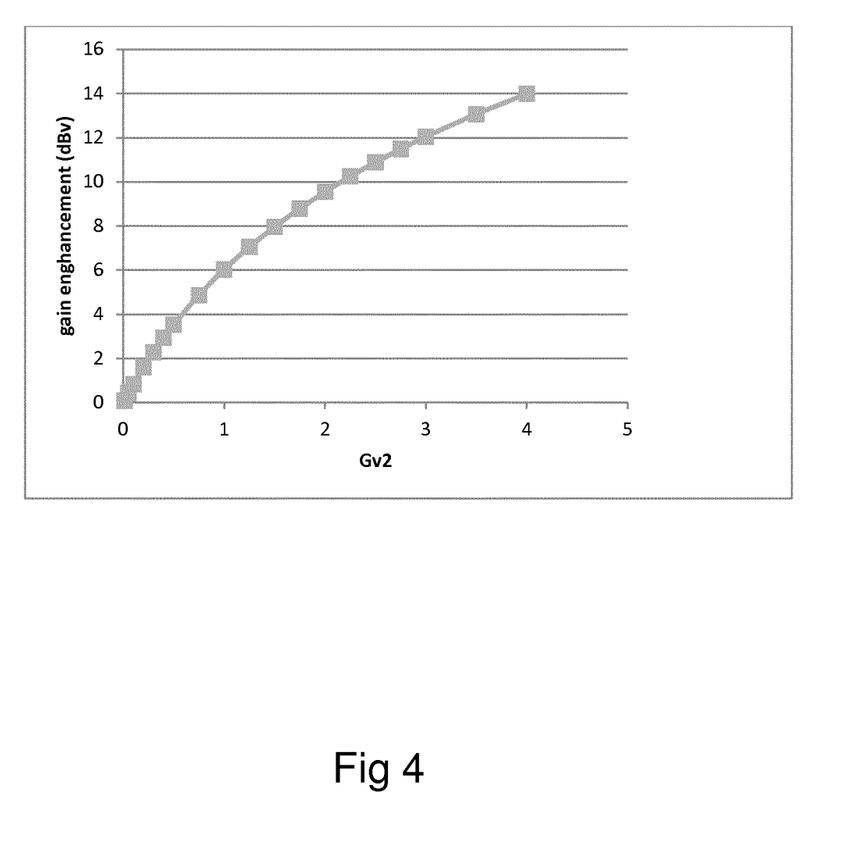
FIG. 4 shows a performance graph of the embodiment of FIG. 3, and FIGS. 5 and 6 show other more detailed versions of the embodiment of FIG. 2.

FIG. 4 shows the conversion gain increase of the frequency converter 300 relative to the conversion gain of a frequency converter with a conventional architecture, i.e. an architecture with an "ordinary" mixer such as the first mixer 105 alone, as a function of $G_{v2}$. When $G_{v2} \ll 1$, the increase is minor, as can be seen from equations 5 and 6. However, as long as $G_{v2} \gg 0.2$, a noticeable improvement in conversion gain is obtained by means of the frequency converter shown in FIG. 3 (as well as those shown in FIGS. 1 and 2).

Figure 5:
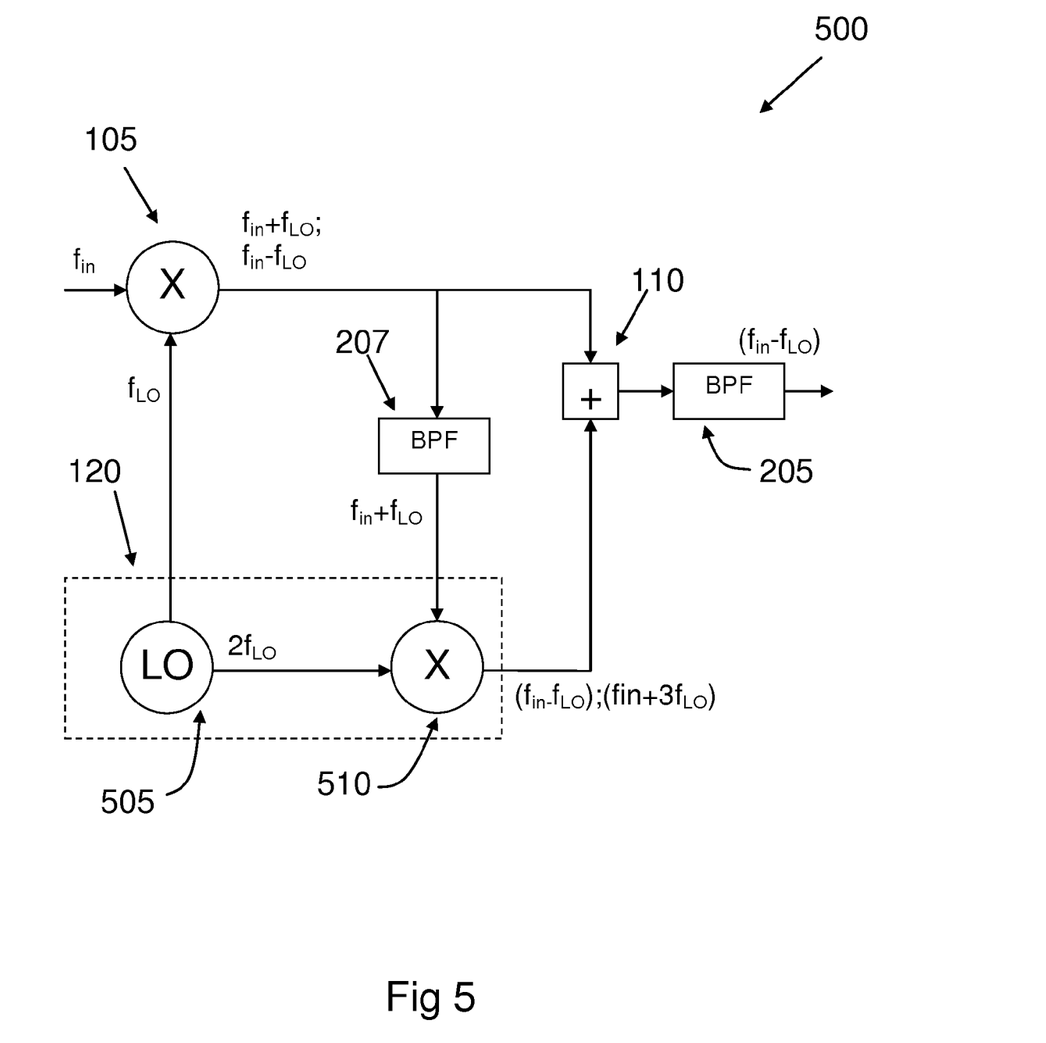

FIG. 5 shows a further embodiment 500 of the frequency converter 200 from FIG. 2. In the embodiment 500, the generating means 120 comprise a dual band LO 505, i.e. an LO which has two output signals, one at a frequency which is a factor 2 of the other. In this case, the dual band LO 505 has output signals at a frequency $f_{LO}$ and $2*f_{LO}$, where the signal at $f_{LO}$ is fed to the mixer 105 and the signal at $2*f_{LO}$ is fed to a mixer 510. Since the mixer 510 receives a signal which is already at $2*f_{LO}$, an ordinary mixer can be used as the mixer 510, instead of a second order sub-harmonic mixer. The term "ordinary mixer" used here refers to a mixer which receives two input signals of frequency $f_{in}$ and $f_{LO}$, and multiplies them, thereby producing an output signal with a sum and a difference frequency component of $f_{IF} = (f_{in} \pm f_{LO})$, i.e., $f_{LO} = \pm(f_{IF}-f_{in})$ which is a factor of two times of the LO signal frequency as compared with a second order sub-harmonic mixer for the given $f_{in}$ and $f_{IF}$.

Figure 6:
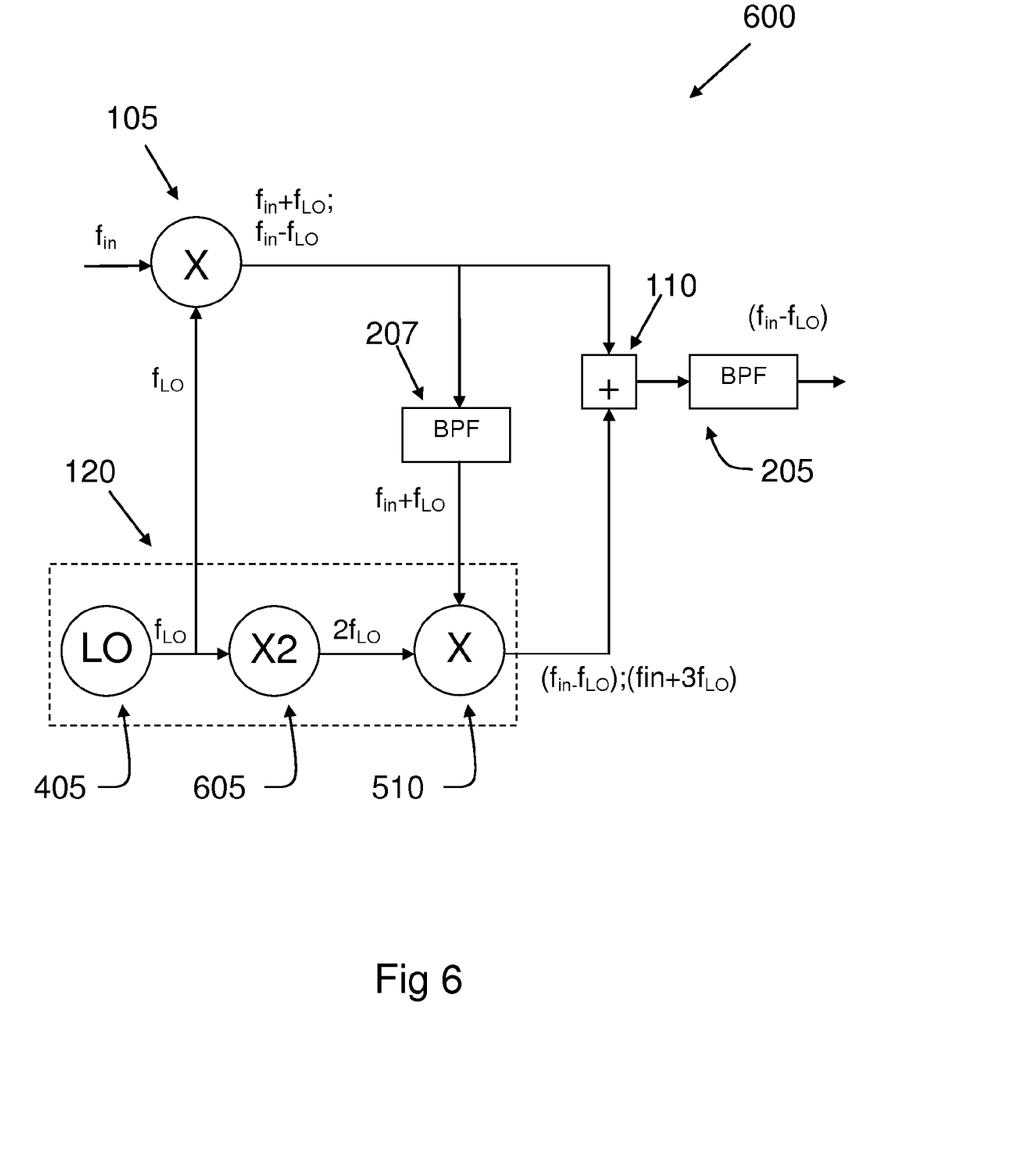

Another way of designing the generating means 120 is shown in an embodiment 600 in FIG. 6: in this embodiment, the generating means 120 comprises an LO 405 similar to the one shown in FIG. 3, i.e. an LO which generates an output signal at one frequency $f_{LO}$. In addition to this, the generating means 120 in the embodiment shown in FIG. 6 comprises an ordinary mixer 510 similar to the one shown in FIG. 5. In order to achieve the desired effect, the generating means 120 in the embodiment shown in FIG. 6 comprises a multiplier 605 between the LO 405 and the mixer 510. Depending on the effect that is desired to achieve, the multiplier 605 can be arranged to multiply the frequency of an input signal by a factor 2, thereby obtaining the effect that has been described in the embodiments above.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A frequency converter comprising:
   a first mixer arranged to receive a first input signal and a second input signal and to output a sum and a difference of said first and second input signals,
   generating means for generating the second input signal and for receiving the output signal of the first mixer and multiplying it by a signal at a frequency which is two times the frequency of the second input signal, thereby generating a product, and
   adding means for obtaining a sum of said product and the output signal from the first mixer.

2. The frequency converter of claim 1, wherein the generating means comprise a local oscillator and a second order sub-harmonic mixer, the second order sub-harmonic mixer being arranged to receive as input signals the output signal from the local oscillator and the output from the first mixer.

3. The frequency converter of claim 1, wherein the generating means comprise a dual-band local oscillator which is arranged to output a signal at frequency fLO to the first mixer and a signal at frequency 2*fLO to a second mixer which is also comprised in the frequency converter and which is arranged to also receive as an input signal the output from the first mixer.

4. The frequency converter of claim 1, wherein the generating means comprise a local oscillator connected to a frequency multiplier with a multiplication factor of two, and a second mixer arranged to receive as input signals the output signal from the frequency multiplier and the product from the first mixer.

5. The frequency converter of claim 1, wherein the generating means is arranged to receive the output signal of the first mixer via a band-pass filter which is arranged to remove a sum or a difference component in the output from the first mixer.

6. The frequency converter of claim 1, further comprising a band-pass filter for removing one of the sum and the difference from the output signal of the first mixer.

7. A more frequency conversion, the method comprising:
   generating a second input signal;
   receiving, at a first mixer, a first input signal and the second input signal;
   outputting, by the first mixer, a first output signal comprising a sum and a difference of said first and second input signals;

receiving, at a filter, the first output signal, wherein the filter is configured to filter the first output signal such that the filter produces a second output signal that comprises the sum said first and second input signals but does not comprise the difference of said first and second input signals;

receiving, at a second mixer, the second output signal;

multiplying, by the second mixer, the second output signal by a signal at a frequency which is two times the frequency of the second input signal, thereby generating a product, and obtaining a sum of said product and the first output signal from the first mixer.

8. The method of claim 7, wherein the second mixer is a second order sub-harmonic mixer.

* * * * *